United States Patent [19]
Ferguson et al.

[11] Patent Number: 5,538,833
[45] Date of Patent: Jul. 23, 1996

[54] HIGH RESOLUTION PHASE EDGE LITHOGRAPHY WITHOUT THE NEED FOR A TRIM MASK

[75] Inventors: Richard A. Ferguson; Lars W. Liebmann, both of Dutchess County, N.Y.; Ronald M. Martino, Fairfield, Conn.; Thomas H. Newman, Westchester County, N.Y.

[73] Assignee: International Business Machines Corporation, Armonk, N.Y.

[21] Appl. No.: 285,575

[22] Filed: Aug. 3, 1994

[51] Int. Cl.⁶ ........................................ G03C 5/00
[52] U.S. Cl. ...................... 430/325; 430/5; 430/313; 430/396
[58] Field of Search ................ 430/325, 5, 313, 430/396

[56] References Cited

U.S. PATENT DOCUMENTS

| | | | |
|---|---|---|---|
| 5,288,569 | 2/1994 | Lin | 430/5 |
| 5,370,975 | 12/1994 | Nakatani | 430/325 |
| 5,382,483 | 1/1995 | Young | 430/5 |

OTHER PUBLICATIONS

European Search Report, dtd Nov. 27, 1995.
Brunner, "170 mm Gates Fabricated by Phase–Shift Mask and Top Anti–Reflector Process", SPIE Proceedings V1927, Mar. 1993, pp. 182–189.
"Control of Critical Dimension Negative Mask", IBM Technical Disclosure Bulletin V20 N8, Jan. 1978.
Jinbo, et al., "Improvement of Phase–Shifter Edge Line Mask Method", Japanese Journal of Applied Physics V30 N11B, Nov. 1991, pp. 2998–3003.
Jinbo, et al., "Application of Blind Method to Phase–Shifting Lithography", VLSI Technology Digest of Technical Papers Symposium, 1992, pp. 112–113.
DeForest, "Photoresist Material and Processes", dtd 1975, pp. 148–151.
Jinbo and Yamashita, "Application of Blind Method to Phase–shifting Lithography", 1992 Symposium of VLSI Technology Digest of Technical Papers, pp. 112–113, IEEE.
L. W. Libermann, et al., "A Comprehensive Evaluation of Major Phase . . . in Logic Designs", in Optical/Laser Microlithography VII, SPIE 2197, p. 612 (1994).
Marc D. Levenson, "Phase–Shifting Mask Strategies: Isolated Dark Lines", Microlithography World, Mar./Apr. 1992, pp. 6–12.
T. Brunner, et al., "170 nm Gates Fabricated by Phase–Shift Mask and Top Anti–Reflector Process", SPIE 1927–16, (1993).

*Primary Examiner*—George F. Lesmes
*Assistant Examiner*—Laura Werner
*Attorney, Agent, or Firm*—Whitham, Curtis, Whitham & McGinn; Charles W. Peterson

[57] ABSTRACT

A process of phase edge lithography is employed in the manufacture of very large scale integrated (VLSI) chips in which chrome images are biased on a phase edge of a phase shift mask (PSM) and the mask overexposed to compensate for the positive bias. This overexposure eliminates any residual images from the phase edge mask with minimum impact to the desired images. This simple process results in a trim-less phase edge process that takes advantage of the improved resolution and process latitude of phase edge PSMs while avoiding layout impacts caused by a trim mask or other phase edge elimination methods.

3 Claims, 8 Drawing Sheets

HIGH RESOLUTION PHASE EDGE LITHOGRAPHY WITHOUT THE NEED FOR A TRIM MASK

BACKGROUND OF THE INVENTION

1. Field of the Invention

The present invention generally relates to lithography in very large scale integrated (VLSI) chip manufacturing and, more particularly, to an improved phase shifted mask (PSM) lithography that enhances the lithographic window and improves resolution with a simpler and cheaper process.

2. Description of the Prior Art

A very large scale integrated (VLSI) complimentary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, these lithography tools are commonly referred to as steppers. The resolution of an optical projection system, such as a lithography stepper, is limited by the wavelength of the light used. State of the art steppers operate with deep ultra violet (DUV) light at 248 nanometer (nm) wavelength.

The photomask consists of chromium patterns on a quartz plate, allowing light to pass wherever the chromium is removed from the mask. The DUV light is projected through the mask onto the photoresist coated wafer, exposing the resist wherever hole patterns are placed on the mask. Exposing the resist to DUV light causes modifications in the molecular structure of the resist polymers which allows developer to dissolve and remove the resist in the exposed areas. (Negative resist systems allow only unexposed resist to be developed away.) The photomask, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found in (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the $\lambda$/NA (NA being the numerical aperture of the exposure system), electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size. Phase shifted mask (PSM) lithography improves the lithographic process latitude by introducing a third parameter on the mask. The electric field vector defining the aerial image, like any vector quantity, has a magnitude and direction (expressed as the phase angle). PSMs capitalize on this vector property by modifying not only the magnitude of the transmitted electric field vector by blocking the light's path with chromium patters, but also the phase angle of the transmitted light at any transparent point on the mask. This phase variation is achieved in PSMs by modifying the length that a light beam travels through the mask material. By recessing the mask by the appropriate depth, light traversing the narrower portion of the mask and light traversing the wider portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask Stategies: Isolated Dark Lines", Marc D. Levenson, *Microlithography World*, March/April 1992, pp. 6–12.

The limits of PSM lithography can be uniquely challenged by the manufacture of high-performance advanced Dynamic Random Access Memory (DRAM) technologies and related logic circuitry. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow isolated lines on the scaled gate level. The requirement for tight line width control on narrow isolated lines drives the requirement of phase edge PSMs for these logic applications.

Phase edge PSM lithography makes use of contrast enhancement caused by a phase transition under an opaque feature on a mask. This phase transition is achieved by etching an appropriate depth into the quartz mask substrate on one side of a narrow line structure on the mask. Not all narrow line structures on the mask close upon themselves, some edges of the etched region will terminate in bare quartz regions. Since the 180° phase transition forces a minimum in the image intensity, narrow dark lines will be printed by these excess phase edges. Currently, the unwanted images are erased using a trim mask.

The three major problems associated with phase edge lithography are design complexity, defect inspection and repair, and layout impacts driven by the required trim mask. While the design complexity and defect issues are common to most phase shifted mask technologies, the requirement for a trim mask and the associated layout constraints are unique to phase edge and alternating phase shifted masks. The fundamental problem with phase edge PSM, and a reason why many are not even considering this powerful technique, is the trade off between process latitude and integration density that has to be made due to the trim mask approach.

SUMMARY OF THE INVENTION

It is therefore an object of the present invention to provide an enhancement of lithographic window and resolution with a simple inexpensive process.

It is another object of the invention to enable more compact chip designs with a degree of resolution enhancement than was previously known before.

According to the invention, there is provided a process of phase edge lithography in which chrome images are biased on a phase edge PSM and the mask overexposed to compensate for the positive bias. This overexposure eliminates any residual images from the phase edge mask with minimum impact to the desired images. This simple process results in a trim-less phase edge process that takes advantage of the improved resolution and process latitude of phase edge PSMs while avoiding layout impacts caused by a trim mask or other phase edge elimination methods.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
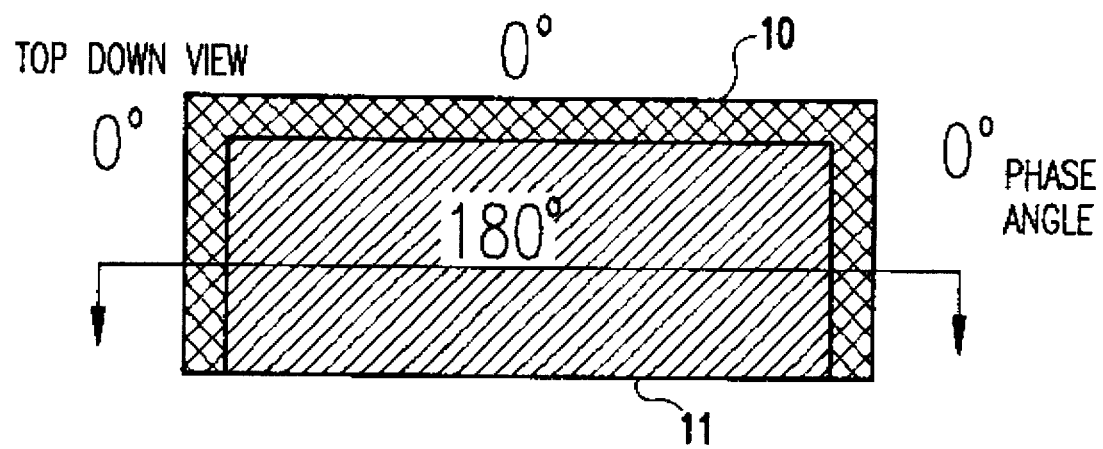
FIG. 1 is a top down view of a generalized horse shoe pattern illustrating the 180° phase transition across the isolated dark lines.
Figure 2:
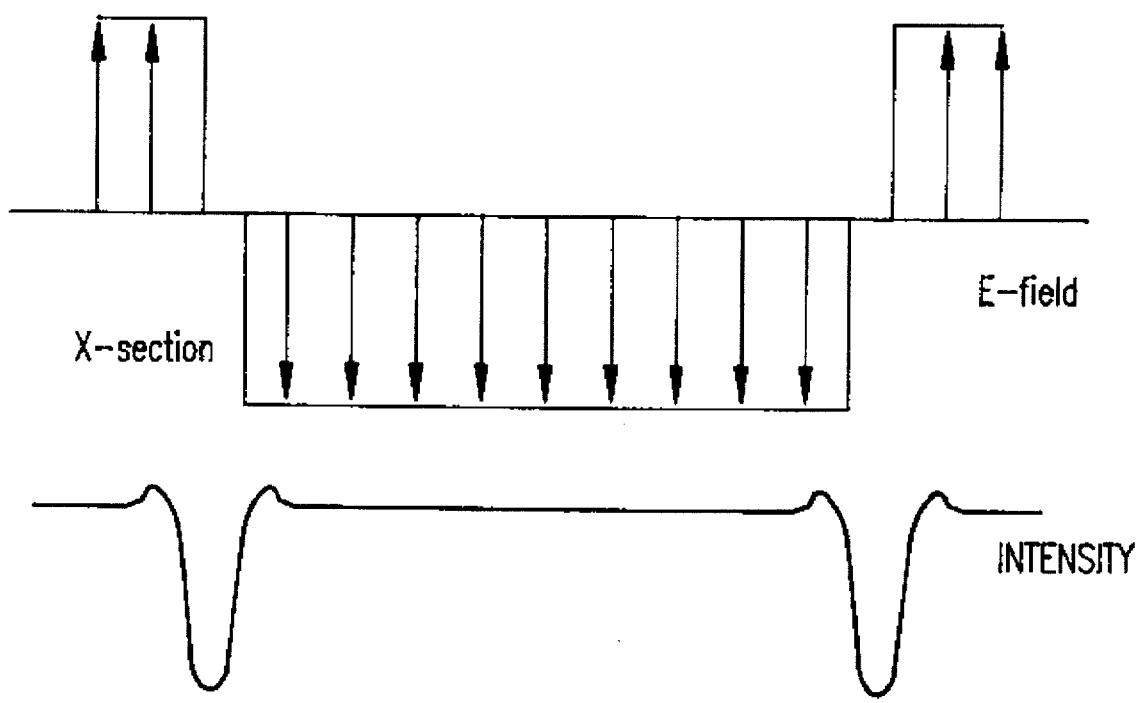
FIG. 2 is a graph showing the cancellation of electric field vectors forcing minimums in the aerial image intensity.
Figure 3:
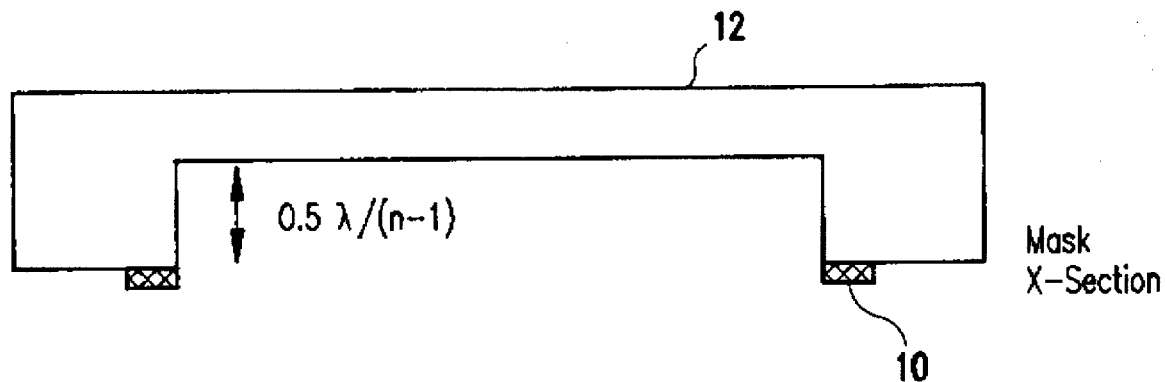
FIG. 3 is a cross-sectional view of the mask showing the etching of the quartz adjacent chrome lines.

Phase edge PSM enhances the lithographic process latitude of isolated dark lines by forcing a minimum of the aerial image intensity by canceling the electric field vectors though a 180° phase transition across these features as shown in FIGS. 1 and 2. FIG. 1 is a top down view showing 180° phase transition across isolated dark lines 10 forming a generalized "horse shoe" pattern. On the outside of these lines, the electric field vector has a phase angle of 0°, whereas within the region 11 bounded by the lines 10, the electric field phase angle is 180°. FIG. 2 illustrates how cancellation of opposing electric field vectors forces a minimum in the aerial image intensity. Currently, this phase transition is accomplished by etching polygons into the quartz substrate 12 adjacent to every critical dimension line 10 as illustrated in the cross-section view of FIG. 3. The depth of the etch is a function of a half wavelength ($\lambda$) of the light inside the mask material relative to in the ambient air.

Figure 4:
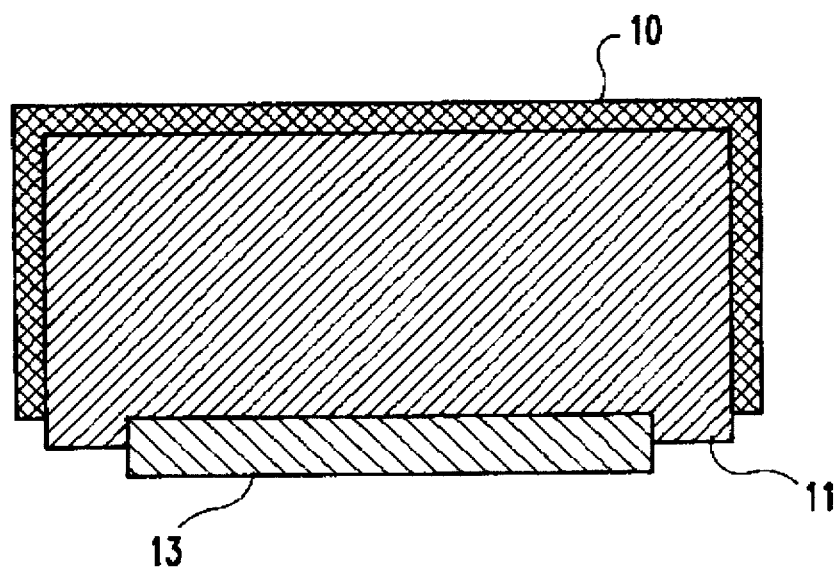
FIG. 4 is a top view of the layout of the mask showing the chrome lines, the phase shift area and the trim mask.

Two mask patterning operations are necessary to define the mask images for phase edge PSM. The first processing steps form all the chrome regions on the mask, as in the standard COG masks. The second processing sequence defines the phase regions of the mask in a self-aligned quartz etch process. As depicted in this simple "horse shoe" design, it is impossible to place the edges of all phase defining regions over existing chrome edges, resulting in residual phase edges on the mask. Since the 180° phase transition forces a minimum in the aerial image intensity, narrow dark lines will be printed by these excess phase edges not bounded by a chrome line. In the case of this simple "horse shoe" pattern, a narrow dark line will be formed at the opening of the pattern. In the current process, electrical device failure by these residual lines is prevented by erasing (or trimming) the unwanted images with a second exposure into the not yet developed resist patterned by the primary phase edge PSM. This trim mask procedure requires the design of trim patterns 13 over all excess phase edges as shown in FIG. 4.

Figure 5:
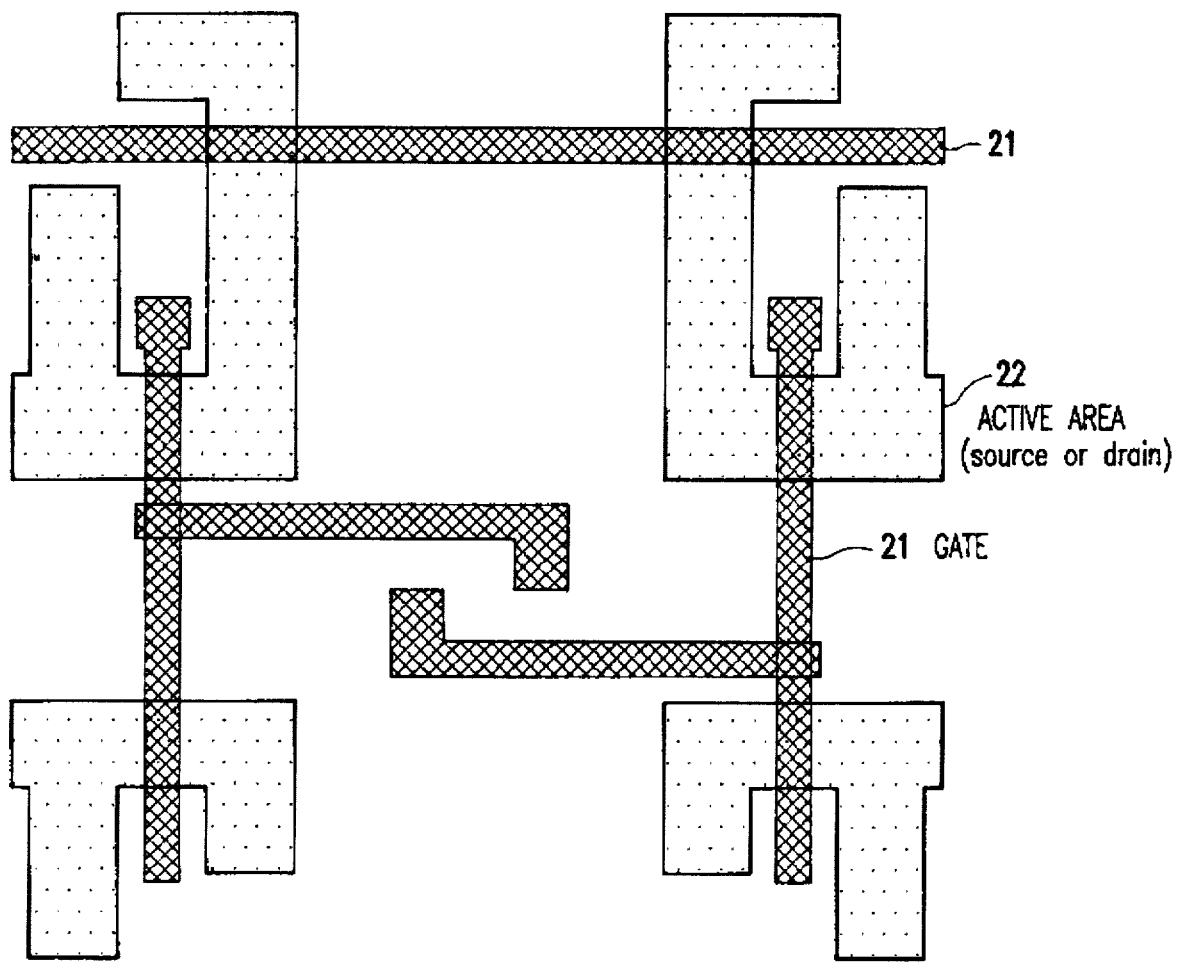
FIG. 5 is a plan view of a standard six gate field effect transistor (FET) static random access memory (SRAM)
Figure 6:
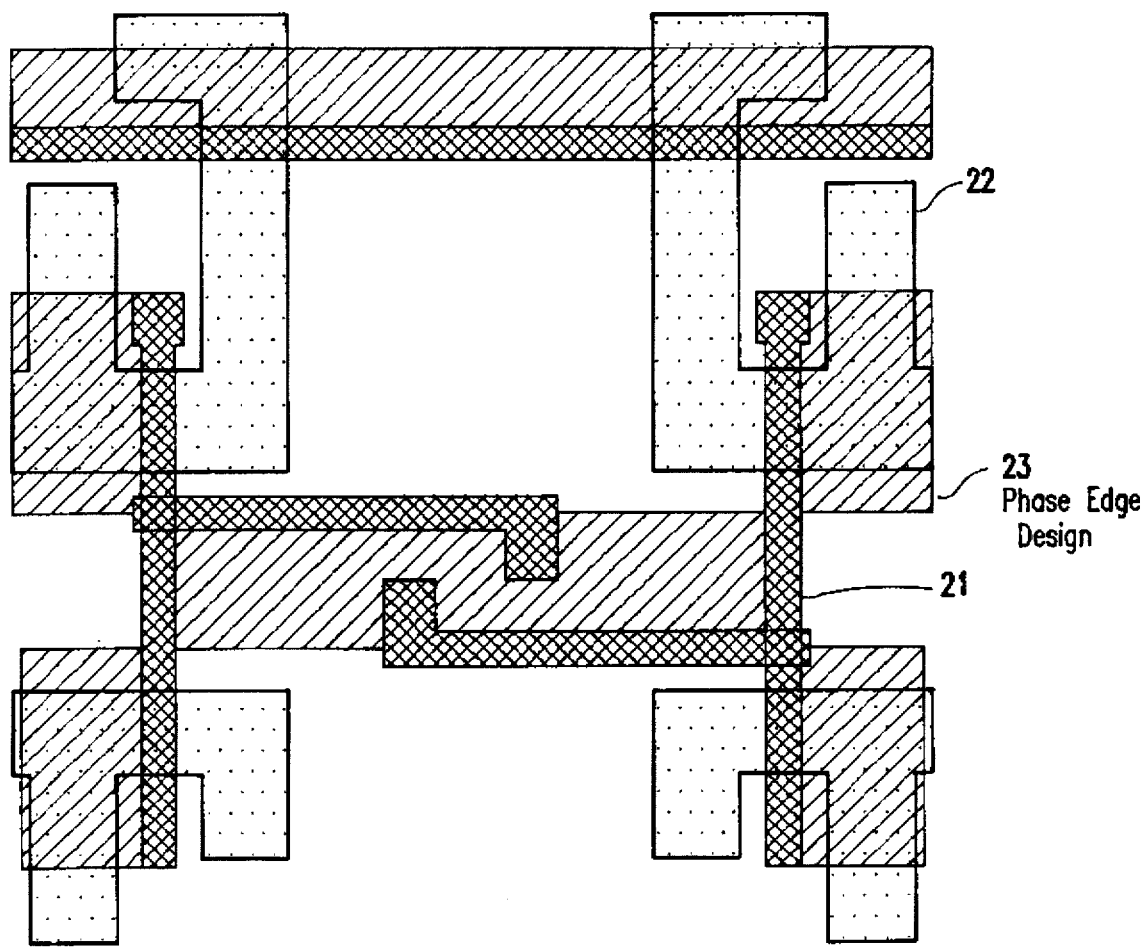
FIG. 6 is a plan view of the FET SRAM with added phase edge design.
Figure 7:
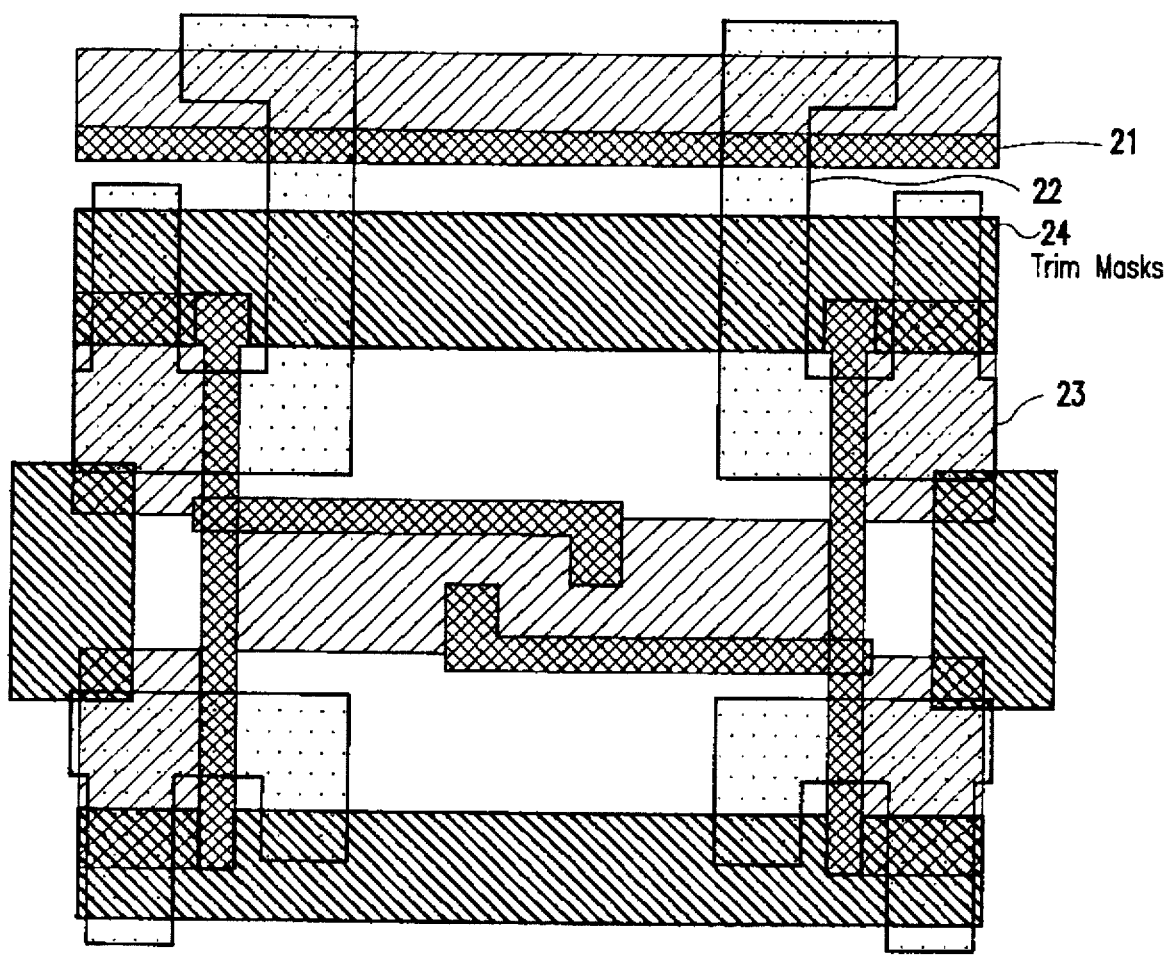
FIG. 7 is a plan view of the FET SRAM with added trim mask design.

Such trim patterns or masks complicate the design process and limit the miniaturization of components. To further illustrate the problem, the design process for phase edge PSMs is outlined for the example of the gate level of a standard six FET static random access memory (SRAM) in FIGS. 5 to 7. The gate level 21 overlaps the active area 22 (i.e., source or drain). All narrow gate and wiring structures need to have a phase transition-associated with them, so that all narrow chrome lines need to be bordered by an unetched region on one side and an etched region on the other. As shown in FIG. 6, this leads to the design of rectangular etch areas 23 that overlay the narrow line structures. In FIG. 6, a phase edge design 23 is added to the narrow gate and wiring structures. Since not all narrow lines close on themselves, some sides of the rectangular etch areas will fall on bare quartz regions where the phase transition will print a narrow line on the wafer. This narrow line has to be erased by a second exposure with a trim mask 24 as shown in FIG. 7. In FIG. 7, trim mask designs 24 are added to erase unwanted narrow lines left by the exposure of the residual phase edge. The erasure can be implemented on the mask or with a second exposure into the undeveloped resist after the gate and phase edge exposure. While other proposals have been made to eliminate the narrow line printed by the phase edge, to date only the trim mask approach seems feasible.

Figure 8:
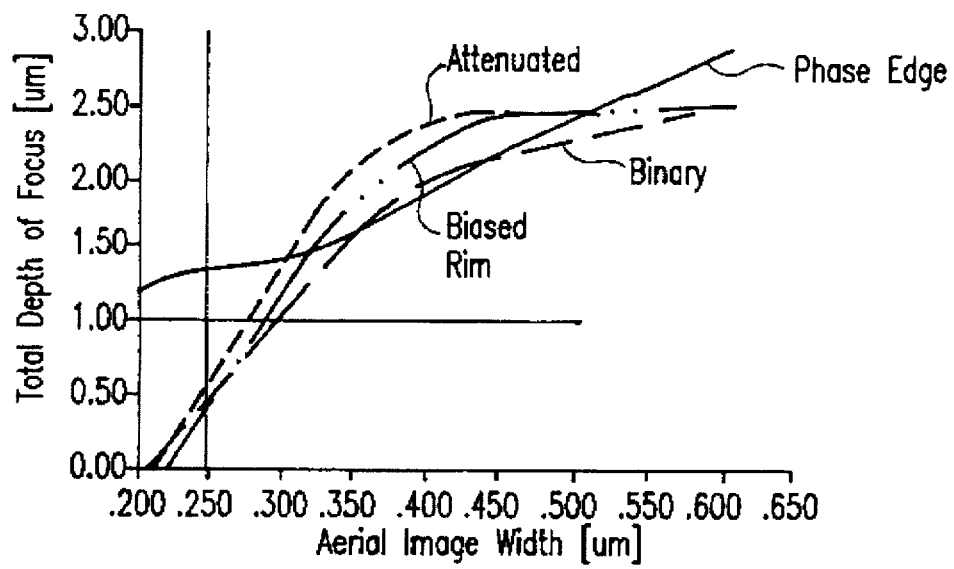
FIG. 8 is a graph comparing lithography techniques.
Figure 9:
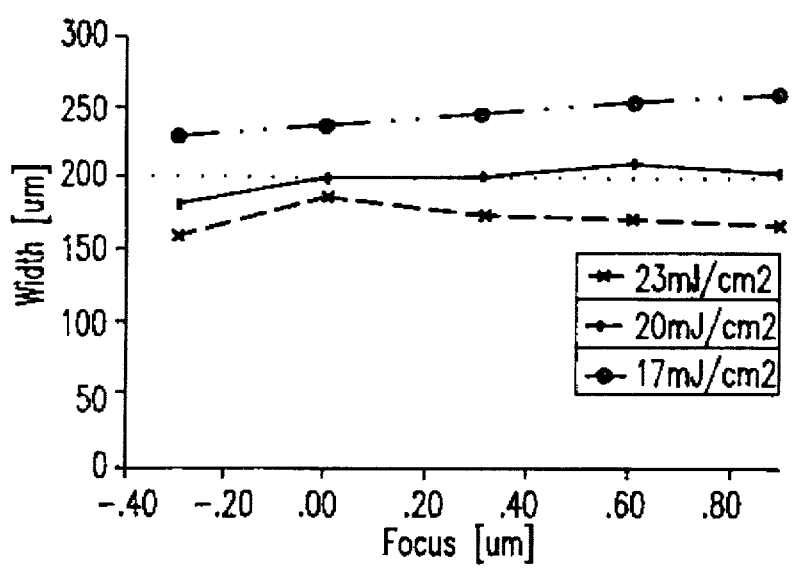
FIG. 9 is a graph of scanning electron microscope (SEM) data from resist images.

It is becoming clear that phase edge lithography can deliver the required process latitude at the desired image sizes. FIG. 8, a graph of simulation data comparing various lithography techniques based on depth of focus at decreasing image size, shows that in the sub 250 nm regime, assuming a required depth of focus of at least 1.0 micrometer ($\mu$m), only phase edge phase shifted lithography looks encouraging. In FIG. 9, scanning electron microscope (SEM) data of resist images from 200 nm isolated gate structures printed with phase edge (+Cr) mask is shown. Excellent depth of focus is obtained for 200 nm line widths. Although not shown, very good image size linearity was achieved in the 100 nm to 300 nm range.

Figure 10:
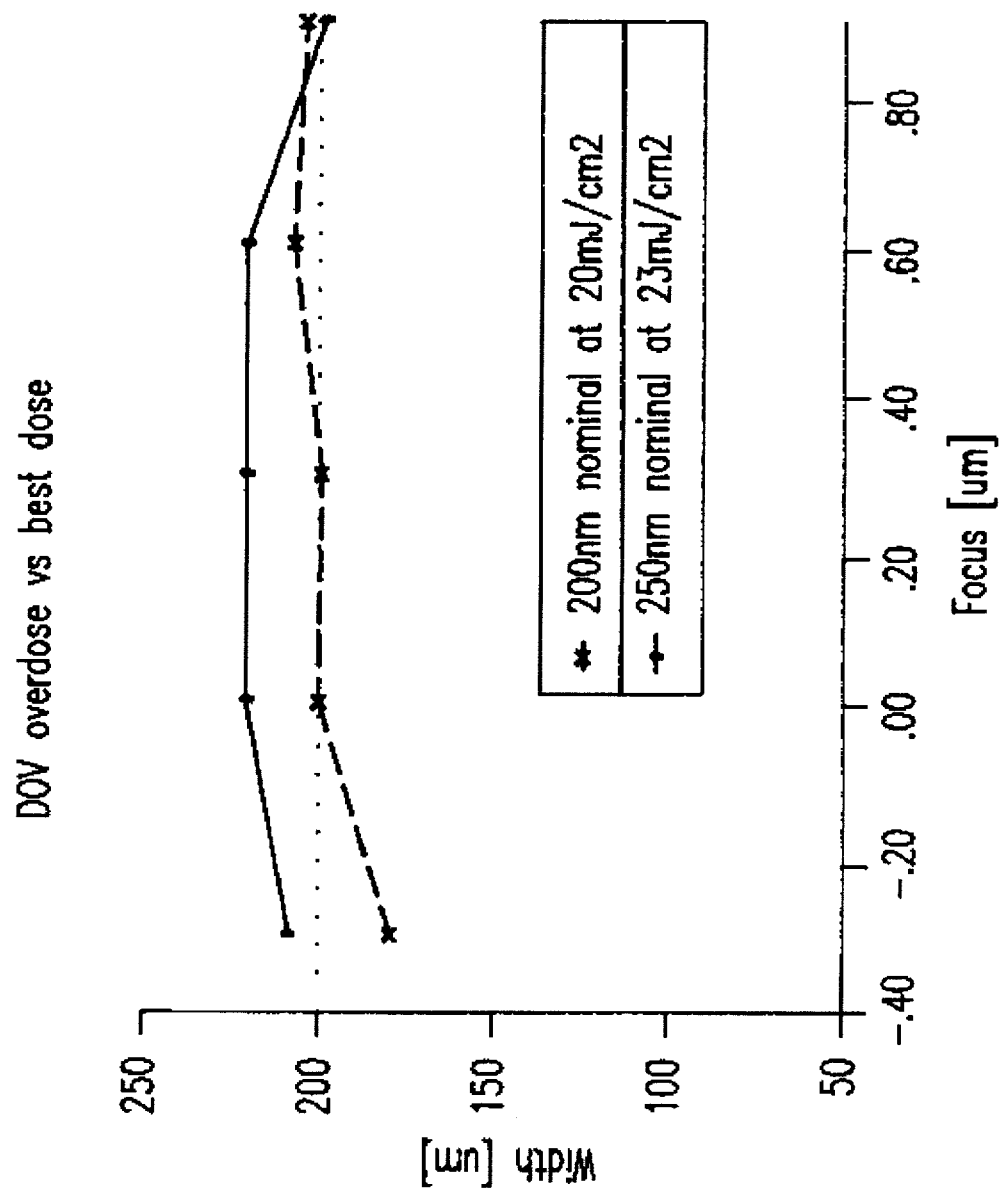
FIG. 10 is a graph of data on the depth of focus of 200 nm resist lines.

Recent work with a CMOS device phase edge mask showed that the phase edge image is extremely sensitive to overexposure. A focus exposure matrix, as shown in FIG. 10 by the dashed line, yielded a best dose of 20 mJ/cm$^2$ at a 0.3 μm focus offset. Under these conditions the residual phase edge printed as a wavy yet solid line. At 23 mJ/cm$^2$ only small pieces of the phase edge image are left on the wafer, while at 26 mJ/cm$^2$ no trace of the phase edge image in clear areas can be found except for unavoidable appendages at the phase edge transition line from opaque to clear areas. At 23 mJ/cm$^2$, a 3 mJ/cm$^2$ overdose, no degradation of process latitude is observed for 200 nm lines in resist, as shown by the solid line of FIG. 10. As can be seen in FIG. 10, the depth of focus of 200 nm resist lines is maintained at 3 mJ over-exposure.

To take advantage of the disproportionately smaller printing of the residual phase edges, attributed to enhanced acid diffusion in the higher contrast phase images, chrome mask images should be oversized by 50 nm (2 grid points on a 25 nm design grid) and then printed at a higher than nominal exposure dose to return the features to their intended sizes. Since the width of the image projected by the residual phase edge is independent of the width of the chrome images, these unwanted features will feel the effect of the feature size reduction caused by the overexposure without the compensating effect of the mask bias, resulting in complete erasure. Thereby the overexposure eliminates any residual images produced by the phase edge mask with minimum impact to the desired images. This simple process results in a trim-less phase edge process that takes advantage of the improved resolution and process latitude of phase edge PSMs, as shown by the dashed line in FIG. 10, while avoiding layout impacts caused by a trim mask or other phase edge elimination methods.

Figure 11:
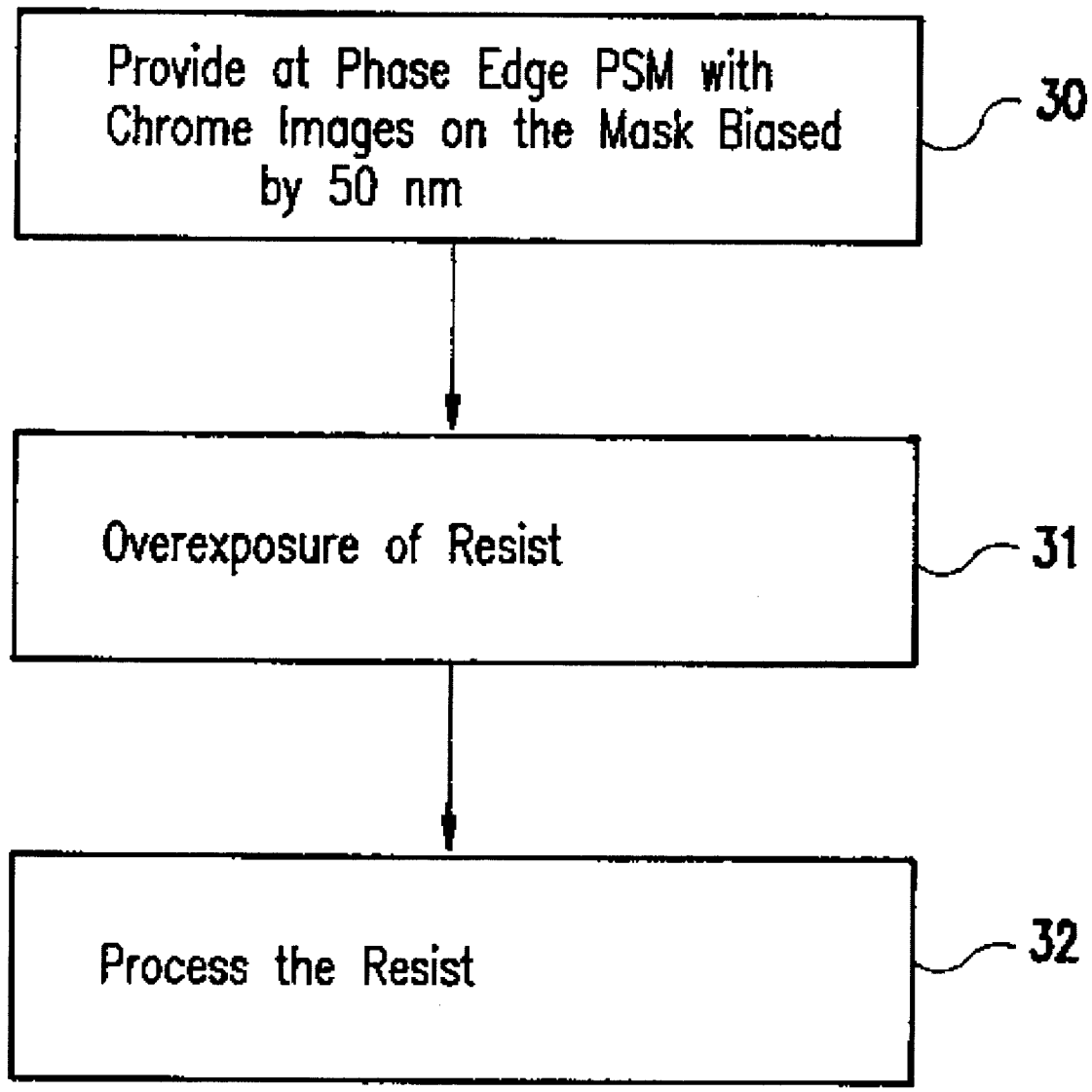
FIG. 11 is a flow chart of the steps of the phase edge lithograph technique according to the present invention.

In FIG. 11, a flow chart is shown to illustrate the steps in the practice of the invention. First, a phase edge PSM is provided with chrome images on the mask biased by two design grids in step 30. The resist is overexposed in step 31 using this mask to compensate for the positive bias of the mask. Preferably, the overexposure is at least 10–15%. The resulting overexposure eliminates any residual images produced by the phase edge mask with minimum impact to the desired images. Finally, the resist is processed in the conventional manner in step 32 to yield an exposure pattern of improved resolution and process latitude.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of high resolution phase edge trim-less lithography comprising the steps of:
   providing a phase edge phase shift mask (PSM) with chrome images on the mask biased a predetermined amount;
   overexposing a resist using the mask to compensate for the positive bias of the mask thereby eliminating any residual images produced by the mask with minimum impact to desired images; and
   processing the exposed resist to yield an exposure pattern of improved resolution and process latitude.

2. The process according to claim 1 wherein the chrome images on the mask are oversized by a predetermined amount, the step of overexposing returning features of the images to intended sizes.

3. The process according to claim 2 wherein the overexposure is at least 10–15%.

* * * * *